United States Patent
Reis et al.

(10) Patent No.: US 7,877,711 B2
(45) Date of Patent: Jan. 25, 2011

(54) METHODS OF DERIVING SWITCH NETWORKS

(75) Inventors: Andre Inacio Reis, Porto Alegre-RS (BR); Felipe Ribeiro Schneider, Copenhagen NV (DK); Renato Perez Ribas, Porto Alegre, RS (BR)

(73) Assignee: Nangate A/S, Herlev (DK)

( * ) Notice: Subject to any disclaimer, the term of this patent is extended or adjusted under 35 U.S.C. 154(b) by 853 days.

(21) Appl. No.: 11/711,828

(22) Filed: Feb. 28, 2007

(65) Prior Publication Data

US 2007/0214439 A1 Sep. 13, 2007

Related U.S. Application Data

(60) Provisional application No. 60/777,561, filed on Mar. 1, 2006.

(51) Int. Cl.
*G06F 17/50* (2006.01)
(52) U.S. Cl. ......................................................... 716/4
(58) Field of Classification Search ...................... 716/4
See application file for complete search history.

(56) References Cited

U.S. PATENT DOCUMENTS

| | | | |
|---|---|---|---|
| 6,938,223 | B2 | 8/2005 | Boppana et al. |
| 7,003,738 | B2 | 2/2006 | Bhattacharya et al. |
| 7,225,423 | B2 | 5/2007 | Bhattacharya et al. |

OTHER PUBLICATIONS

V.P. Correia and A.I. Reis. "Advanced Technology Mapping for Standard-Cell Generators". SBCC104, pp. 254-259 (2004).

R. Ebendt, W. Gunther, R. Drechsler, "Minimization of the Expected Path Length in BDDs Based on Local Changes," Design Automation Conference, 2004. Proceedings of the ASP-DAC 2004. Asia and South Pacific. 27-30 pp. 866-871. Jan. 2004.

M. Kaneko and J. Tian. "Concurrent Cell Generation and Mapping for CMOS Logic Circuits," ASP-DAC 1997; pp. 247-252.

P. Kudva, G. Gopalakrishman, H. Jacobson and S.M. Nowick. "Synthesis of Hazard-Free Customized CMOS Complex-Gate Networks Under Multiple-Input Changes", DAC 1996. pp. 77-82.

E.F. Moore. "Table of Four-Relay Contact Networks." In: Logical Design of Electrical Circuits, by R.A. Higonnet and R.A. Grea. McGraw-Hill, New York, NY 1958.

S. Nagayama and T. Sasao, "On the Minimization of Longest Path Length for Decision Diagrams," International Workshop on Logic and Synthesis (IWLS-2004), Jun. 2-4, Temecula, California, U.S.A., pp. 28-35.

(Continued)

*Primary Examiner*—Stacy A Whitmore
(74) *Attorney, Agent, or Firm*—Harness, Dickey & Pierce, P.L.C.

(57) ABSTRACT

A method of determining the lowest possible number of serial switches in a pull-up plane or a pull-down plane of a network implementing a logic function. The same method may be used in any multi-value function. Also, the method may be used in generating switch networks to be implemented as standard cells implementations of combinational logic cells. The minimum number of switches can also be used as a criterion for technology mapping devoted to automatic cell generation. The method is based on the use of a covering table to derive a sum of products where individual cubes have a minimum literal count.

16 Claims, 16 Drawing Sheets

Methodology flow diagram for minimum length switch stacks.

OTHER PUBLICATIONS

Ninomiya. Catalog of four variable two-terminal switch circuits. In M.A. Harrison. Introduction to Switching and Automata Theory. App. 5. McGraw-Hill Book Company, pp. 408-472, 1965.

C. Piguet, J. Zahnd, A. Stauffer, M. Bertarionne. "A Metal-Oriented Layout Structure for CMOS Logic," IEEE Journal of Solid-State Circuits, vol. 19, Issue 3, Jun. 1984 pp. 425-436.

R.E.B. Poli, F.R. Schneider, R.P. Ribas and A.I. Reis. "Unified theory to build cell-level transistor networks from BDDs,". SBCCI 2003. pp. 199-204.

F.R. Schneider, R.P. Ribas, S.S. Sapatnekar, A.I. Reis, "Exact lower bound for the number of switches in series to implement a combinational logic cell," Int'l Conf. on Computer Design Proc., pp. 357-362 (Oct. 2-5, 2005).

K. Tanaka, Y. Kambayashi, "Transduction Method for Design of Logic Cell Structure," ASP-DAC 2004. pp. 600-603.

Olivier Coudert, et al., "New Ideas for Solving Covering Problems," Synopsys, pp. 1-6.

Olivier Coudert, "On Solving Covering Problems," Synopsys Inc., USA, 33$^{rd}$ Design Automation Conference, 1996, pp. 1-6.

Randy H. Katz, "Contemporary Logic Design," 1994, pp. 85-89.

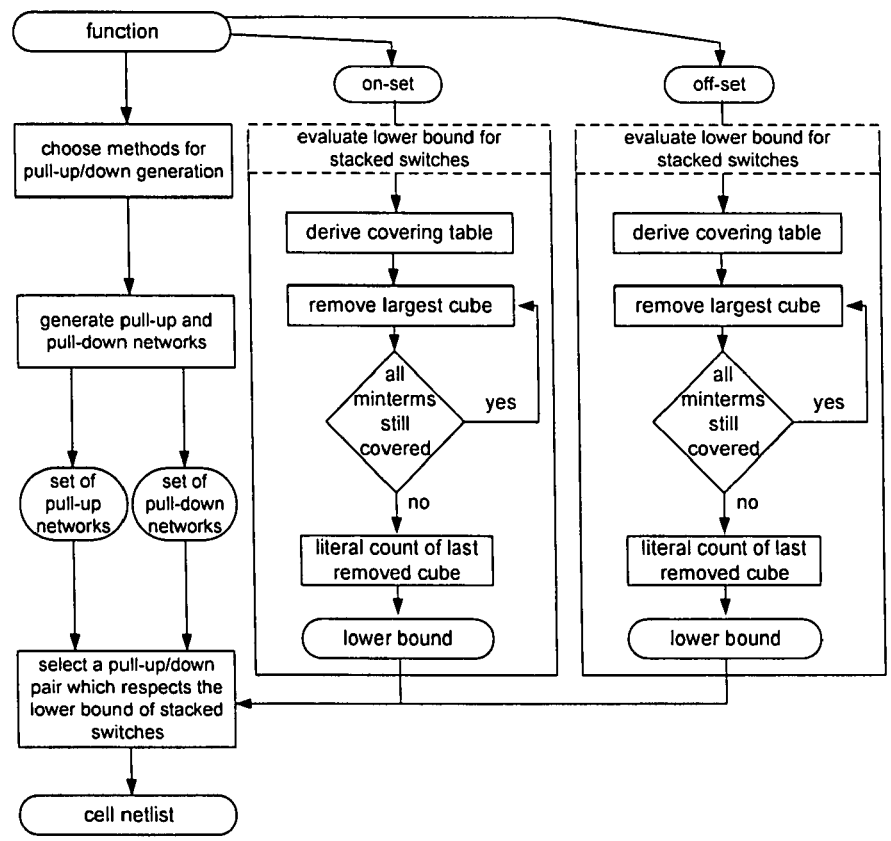
Figure 1: Methodology flow diagram for minimum length switch stacks.
| A | B | C | D | OUT | |
|---|---|---|---|-----|---|
| 0 | 0 | 0 | 0 | 1 | |
| 0 | 0 | 0 | 1 | 1 | 7 |
| 0 | 0 | 1 | 0 | 1 | |
| 0 | 0 | 1 | 1 | 0 | |
| 0 | 1 | 0 | 0 | 1 | |
| 0 | 1 | 0 | 1 | 0 | 9 |
| 0 | 1 | 1 | 0 | 0 | |
| 0 | 1 | 1 | 1 | 1 | |
| 1 | 0 | 0 | 0 | 1 | |
| 1 | 0 | 0 | 1 | 0 | 1 |
| 1 | 0 | 1 | 0 | 0 | |
| 1 | 0 | 1 | 1 | 0 | |
| 1 | 1 | 0 | 0 | 0 | |
| 1 | 1 | 0 | 1 | 0 | 0 |
| 1 | 1 | 1 | 0 | 0 | |
| 1 | 1 | 1 | 1 | 0 | |
Figure 2: Truth-table for the function $(0197)_{16}$.

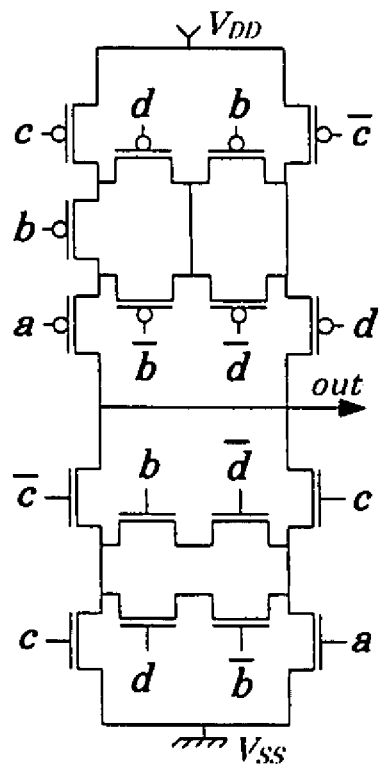
Figure 3: Bridge-based 5-4 cell for function $(0197)_{16}$.
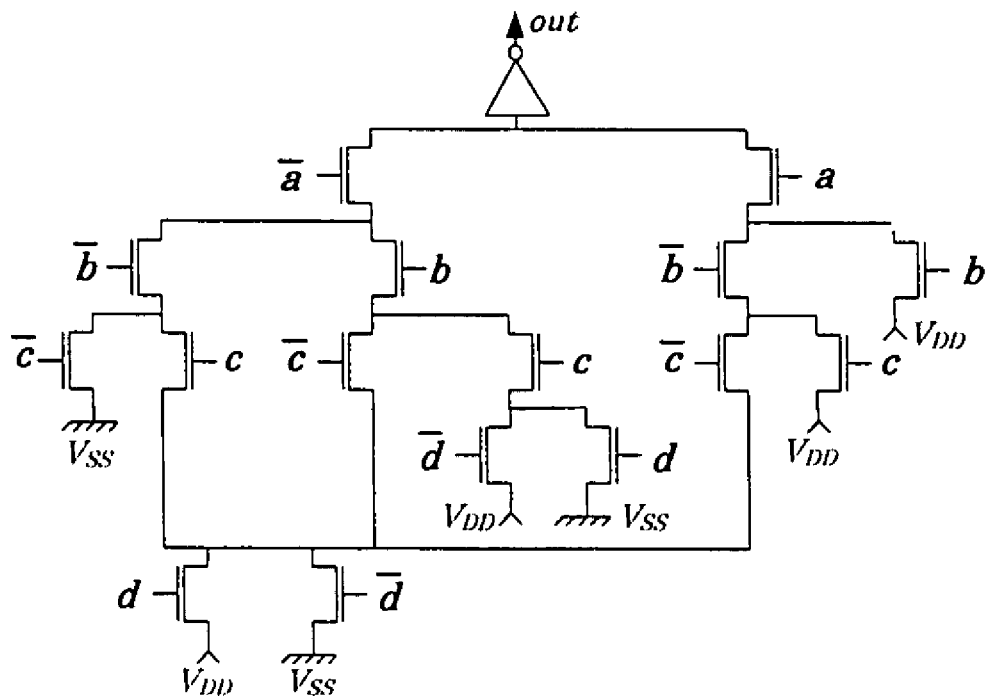
Figure 4: BDD-based 4-4 PTL for function $(0197)_{16}$.

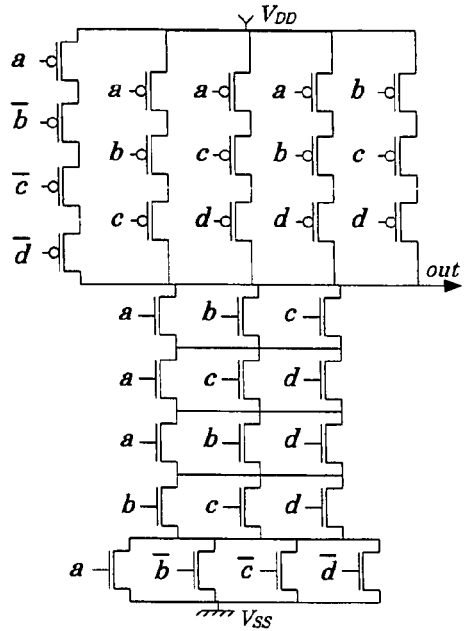
(a) 5-4 cell from on-set equation (direct polarity).
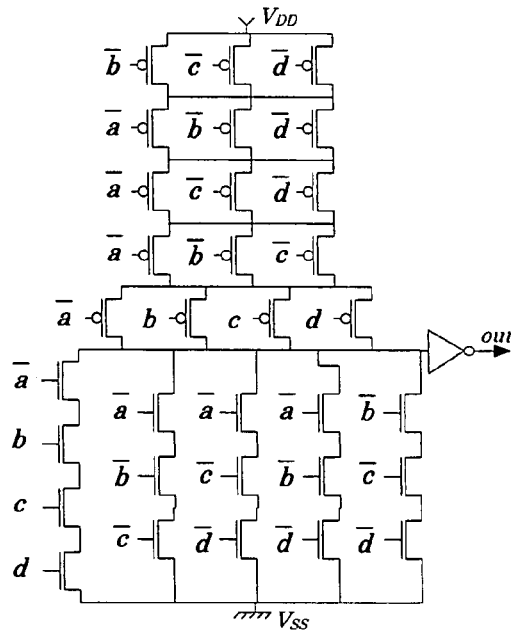
(b) 4-5 cell from on-set equation (inverted polarity).
Figure 5: CSP CMOS cells obtained from the on-set equations of function $(0197)_{16}$.
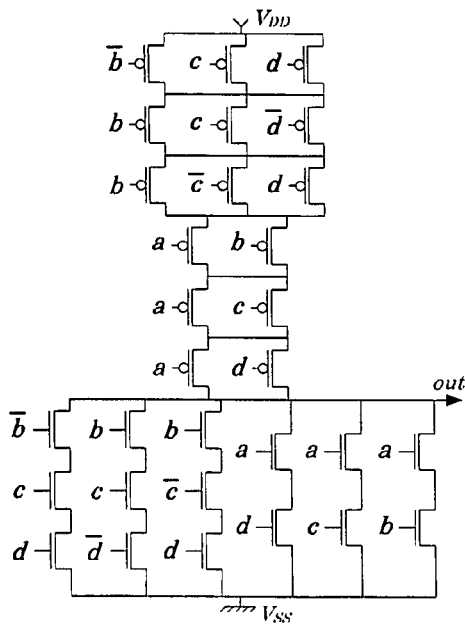
(a) 6-3 cell from off-set equation (direct polarity).
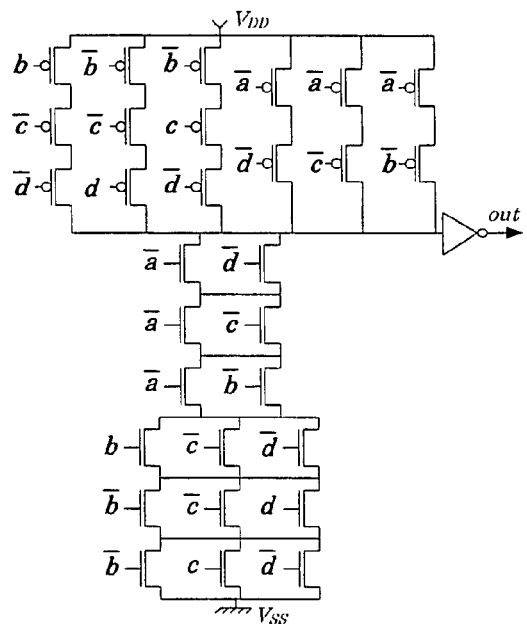
(b) 3-6 cell from off-set equation (inverted polarity).
Figure 6: CSP CMOS cells obtained from the off-set equations of function $(0197)_{16}$.

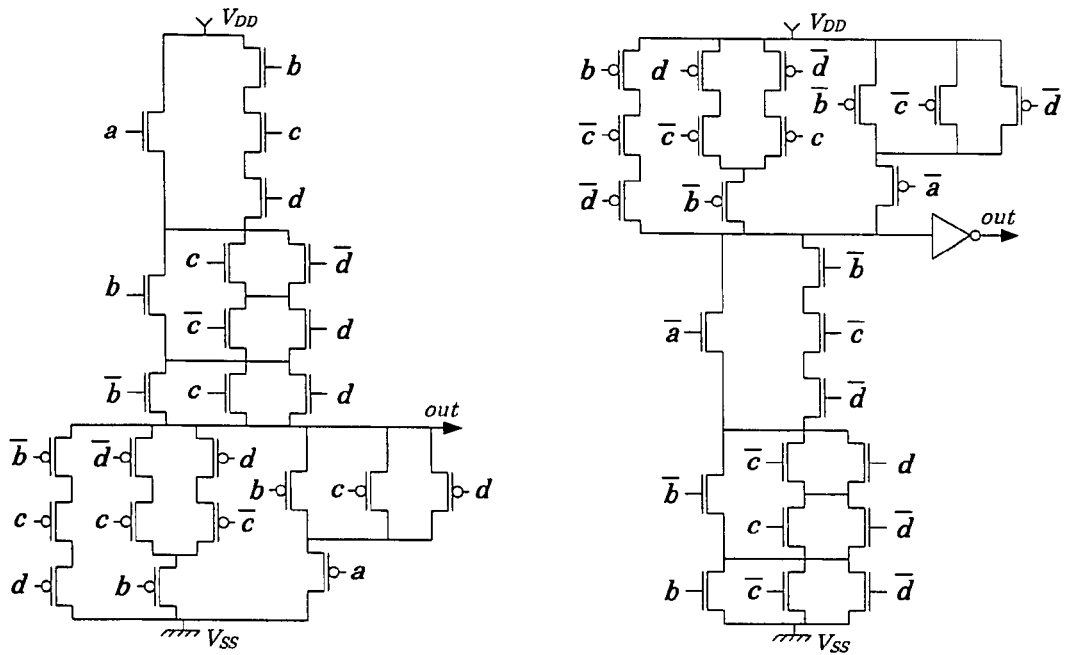
(a) 3-6 cell from on-set equation (direct polarity).
(b) 6-3 cell from on-set equation (inverted polarity).
Figure 7: CSP CMOS cells (factorized) for function $(0197)_{16}$ – on-set equation.
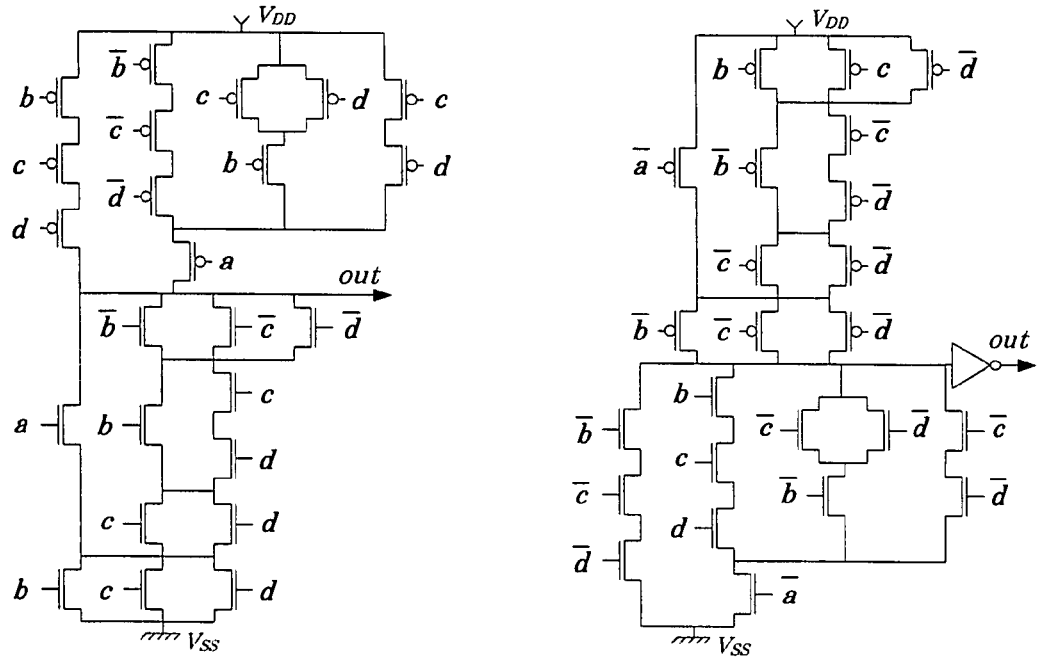
(a) 5-4 cell from off-set equation (direct polarity).
(b) 4-5 cell from off-set equation (inverted polarity).
Figure 8: CSP CMOS cells (factorized) for function $(0197)_{16}$ – off-set equation.

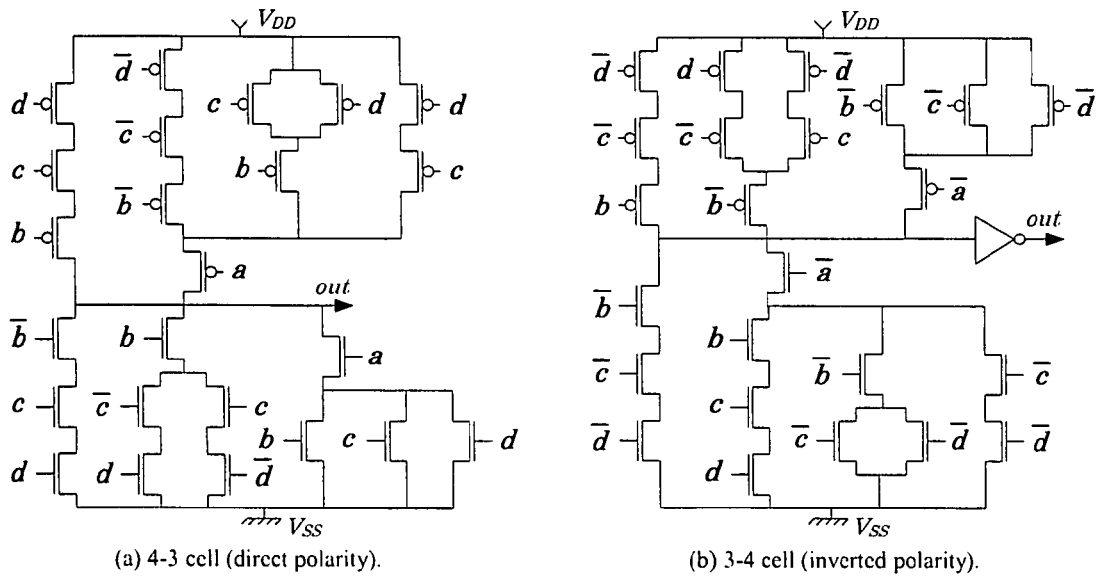
Figure 9: Covering table obtained from the on-set of function $(0197)_{16}$.
Figure 10: Covering table obtained from the off-set of function $(0197)_{16}$.
(a) 4-3 cell (direct polarity).
(b) 3-4 cell (inverted polarity).
Figure 11: NCSP CMOS cells for function $(0197)_{16}$.

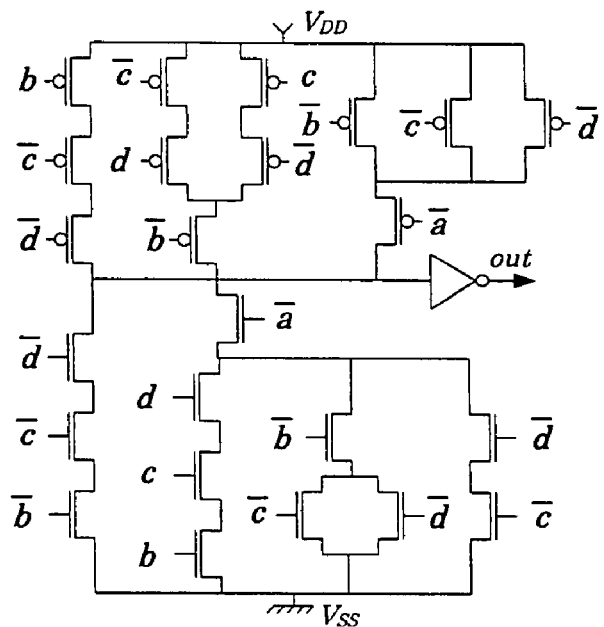
Figure 12: Alternative NCSP CMOS cell from the one in Fig. 11.a.
| E = 0 | | | | | |
|---|---|---|---|---|---|
| A | B | C | D | OUT | |
| 0 | 0 | 0 | 0 | 1 | 3 |
| 0 | 0 | 0 | 1 | 1 | |
| 0 | 0 | 1 | 0 | 0 | |
| 0 | 0 | 1 | 1 | 0 | |
| 0 | 1 | 0 | 0 | 1 | 3 |
| 0 | 1 | 0 | 1 | 1 | |
| 0 | 1 | 1 | 0 | 0 | |
| 0 | 1 | 1 | 1 | 0 | |
| 1 | 0 | 0 | 0 | 1 | F |
| 1 | 0 | 0 | 1 | 1 | |
| 1 | 0 | 1 | 0 | 1 | |
| 1 | 0 | 1 | 1 | 1 | |
| 1 | 1 | 0 | 0 | 0 | 2 |
| 1 | 1 | 0 | 1 | 1 | |
| 1 | 1 | 1 | 0 | 0 | |
| 1 | 1 | 1 | 1 | 0 | |
| E = 1 | | | | | |
|---|---|---|---|---|---|
| A | B | C | D | OUT | |
| 0 | 0 | 0 | 0 | 1 | 1 |
| 0 | 0 | 0 | 1 | 0 | |
| 0 | 0 | 1 | 0 | 0 | |
| 0 | 0 | 1 | 1 | 0 | |
| 0 | 1 | 0 | 0 | 1 | D |
| 0 | 1 | 0 | 1 | 0 | |
| 0 | 1 | 1 | 0 | 1 | |
| 0 | 1 | 1 | 1 | 1 | |
| 1 | 0 | 0 | 0 | 1 | 1 |
| 1 | 0 | 0 | 1 | 0 | |
| 1 | 0 | 1 | 0 | 0 | |
| 1 | 0 | 1 | 1 | 0 | |
| 1 | 1 | 0 | 0 | 1 | F |
| 1 | 1 | 0 | 1 | 1 | |
| 1 | 1 | 1 | 0 | 1 | |
| 1 | 1 | 1 | 1 | 1 | |
Figure 13: Truth-table for the function $(F1D12F33)_{16}$.

|   | 0 | 1 | 4 | 5 | 8 | 9 | 10 | 11 | 13 | 16 | 20 | 22 | 23 | 24 | 28 | 29 | 30 | 31 |
|---|---|---|---|---|---|---|---|---|---|---|---|---|---|---|---|---|---|---|
| $\bar{a}\cdot b\cdot \bar{c}$ |   |   |   |   | x | x | ⓧ | x |   |   |   |   |   |   |   |   |   |   |
| $\bar{a}\cdot \bar{c}\cdot \bar{d}$ | x | x |   |   | x | x |   |   |   |   |   |   |   |   |   |   |   |   |
| $\bar{c}\cdot \bar{d}\cdot \bar{e}$ |   | x |   |   | x |   |   |   |   | x |   |   |   | ⓧ |   |   |   |   |
| $b\cdot \bar{d}\cdot \bar{e}$ | ⓧ |   | x |   |   |   |   |   |   |   | x | x |   |   |   |   |   |   |
| $\bar{a}\cdot b\cdot \bar{d}$ | x | x | x | x |   |   |   |   |   |   |   |   |   |   |   |   |   |   |
| $\bar{a}\cdot \bar{d}\cdot e$ |   | ⓧ |   | x |   | x |   |   | x |   |   |   |   |   |   |   |   |   |
| $b\cdot c\cdot \bar{d}\cdot e$ |   |   |   |   |   |   |   |   | x |   |   |   |   |   |   | x |   |   |
| $a\cdot b\cdot c$ |   |   |   |   |   |   |   |   |   |   |   |   |   |   | ⓧ | x | x | x |
| $a\cdot c\cdot \bar{e}$ |   |   |   |   |   |   |   |   |   | x | x |   |   | x |   | x |   |   |
| $a\cdot \bar{d}\cdot \bar{e}$ |   |   |   |   |   |   |   |   |   |   | x | x |   | x | x |   |   |   |
| $a\cdot c\cdot d$ |   |   |   |   |   |   |   |   |   |   |   | x | ⓧ |   |   |   | x | x |

Figure 14: Covering table obtained from the on-set of function $(F1D12F33)_{16}$.

|   | 2 | 3 | 6 | 7 | 12 | 14 | 15 | 17 | 18 | 19 | 21 | 25 | 26 | 27 |
|---|---|---|---|---|---|---|---|---|---|---|---|---|---|---|
| $a\cdot \bar{c}\cdot d$ |   |   |   |   |   |   |   | x | x |   |   |   | ⓧ | x |
| $b\cdot \bar{c}\cdot d$ | ⓧ | x |   |   |   |   |   |   | x | x |   |   |   |   |
| $\bar{a}\cdot \bar{b}\cdot d$ | x | x | x | x |   |   |   |   |   |   |   |   |   |   |
| $\bar{a}\cdot c\cdot d$ |   |   | x | x |   | x | ⓧ |   |   |   |   |   |   |   |
| $\bar{a}\cdot b\cdot c\cdot \bar{e}$ |   |   |   |   | ⓧ | x |   |   |   |   |   |   |   |   |
| $a\cdot \bar{c}\cdot e$ |   |   |   |   |   |   |   | ⓧ |   | x |   | x |   | x |
| $a\cdot \bar{b}\cdot d\cdot e$ |   |   |   |   |   |   |   | x |   | ⓧ |   |   |   |   |

Figure 15: Covering table obtained from the off-set of function $(F1D12F33)_{16}$.

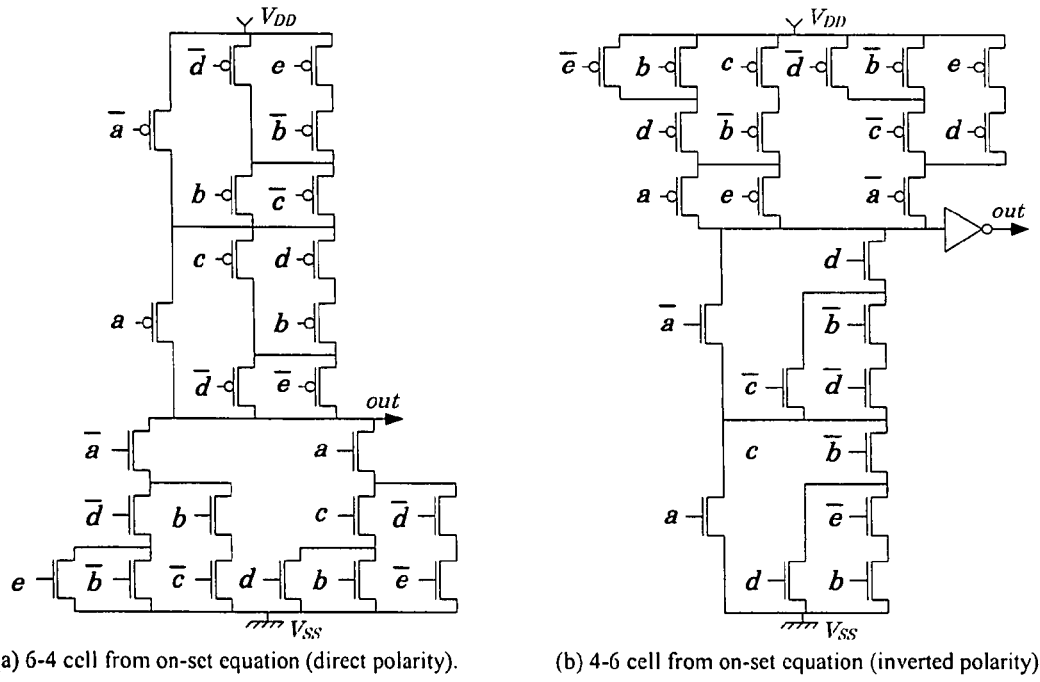
(a) 6-4 cell from on-set equation (direct polarity).   (b) 4-6 cell from on-set equation (inverted polarity).
Figure 16: CSP CMOS cells obtained from the on-set equations of function $(F1D12F33)_{16}$.
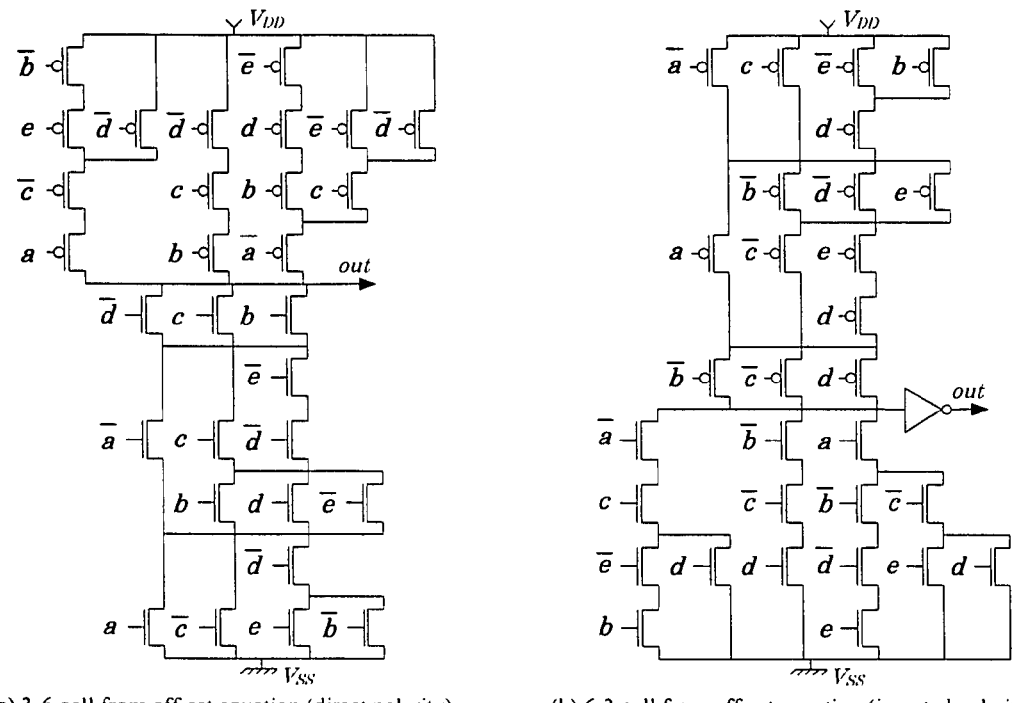
(a) 3-6 cell from off-set equation (direct polarity).   (b) 6-3 cell from off-set equation (inverted polarity).
Figure 17: CSP CMOS cells obtained from the off-set equations of function $(F1D12F33)_{16}$.

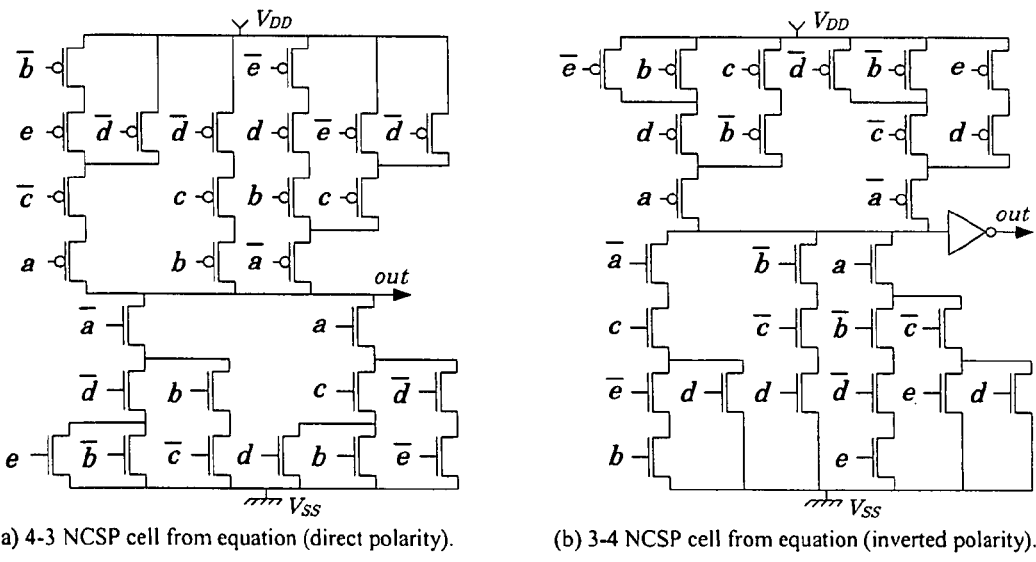
(a) 4-3 NCSP cell from equation (direct polarity).
(b) 3-4 NCSP cell from equation (inverted polarity).
Figure 18: NCSP CMOS cells for function $(F1D12F33)_{16}$.
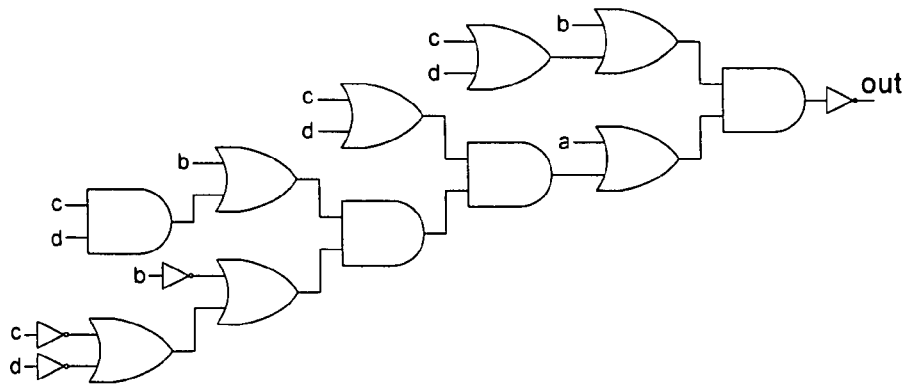
Figure 19: A circuit to be mapped with cells from a library.
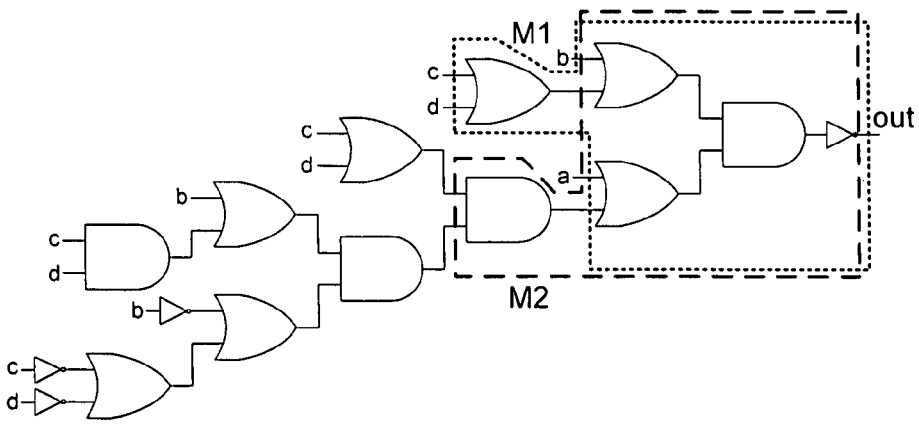
Figure 20: Two different matchings for the same node on the circuit of Fig. 19.

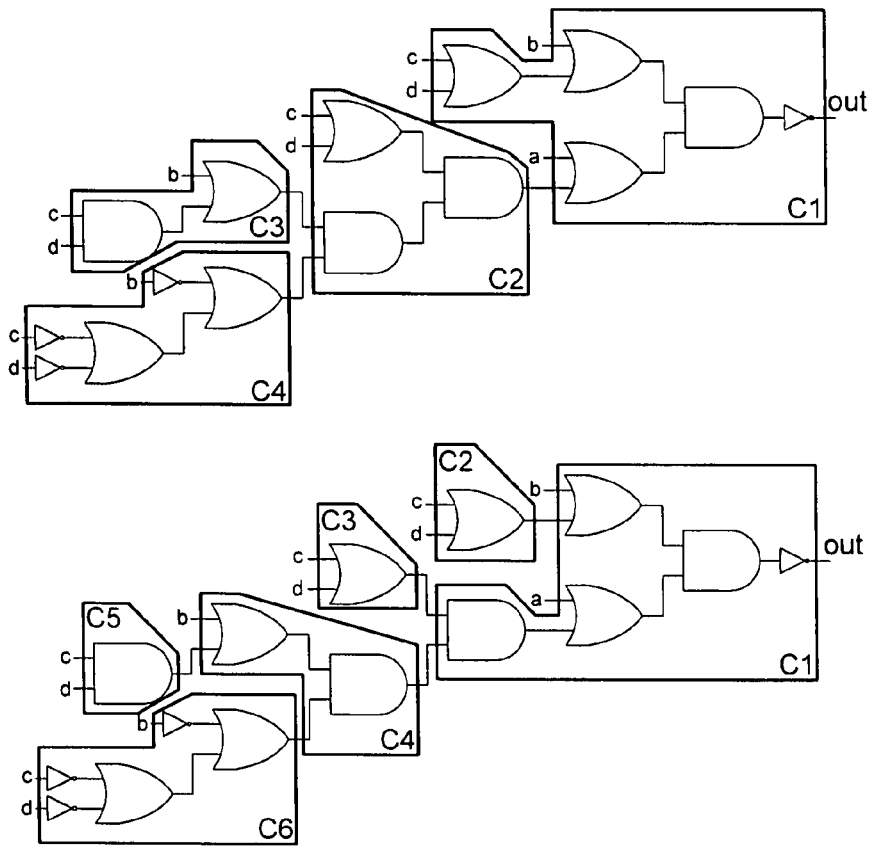
Figure 21: Two alternative coverings using the matchings of Fig. 20.
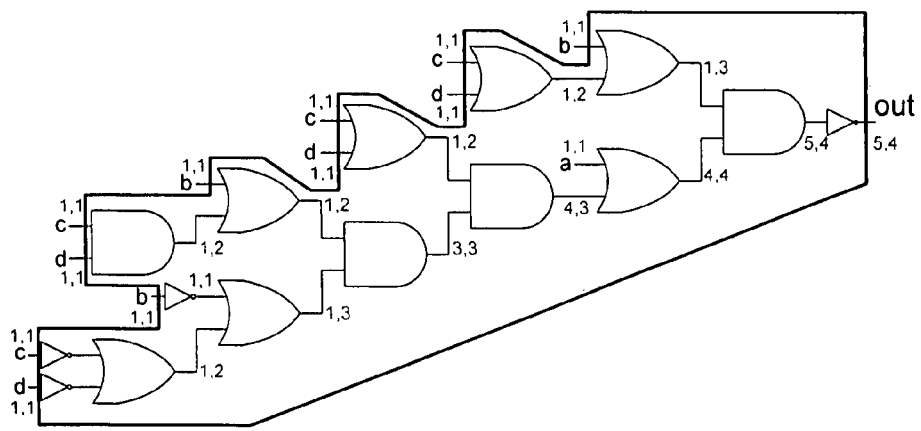
Figure 22: Counting serial transistors by serial parallel association of the network of Fig. 19.

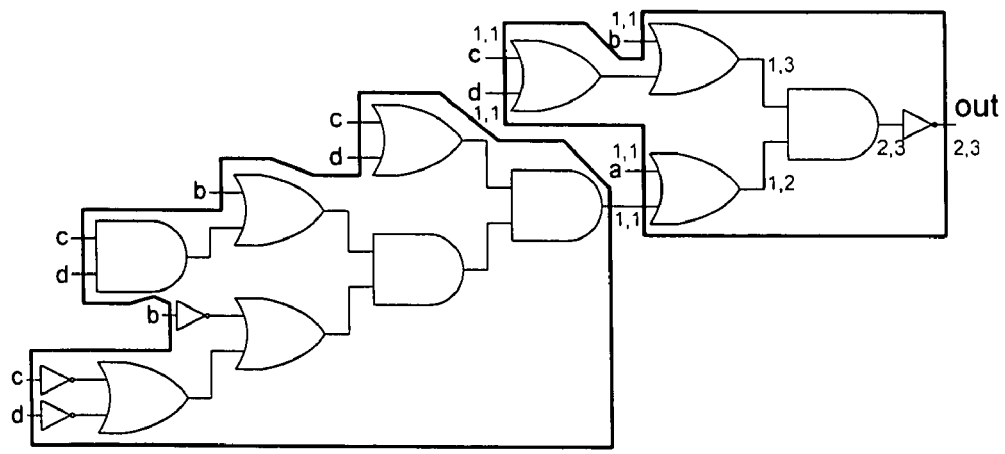
Figure 23: Division of the circuit of Fig. 19 into two cells.
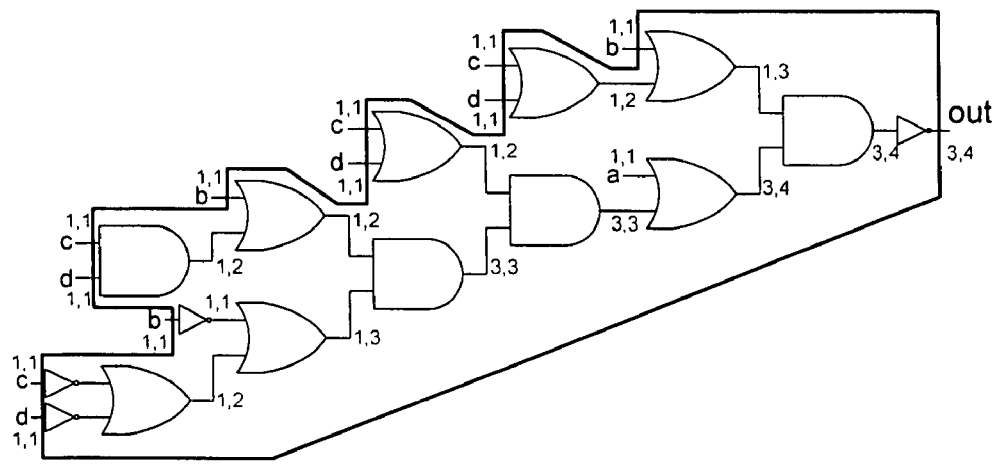
Figure 24: Counting of serial transistors in the network of Fig. 19 by the method of the invention.

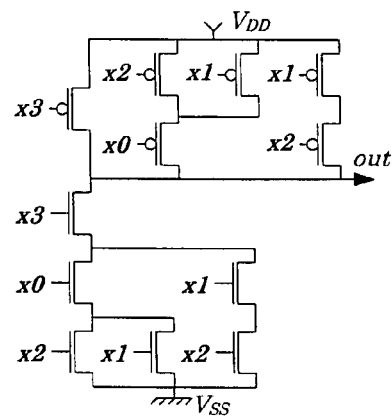
| Figure 25: | NCSP Circuit for the function $(577F)_{16}$. |
|---|---|
| on-set: | !x0*(!x2+!x1)+!x1*!x2+!x3 |
| off-set: | x3*(x0*(x2+x1)+x1*x2) |
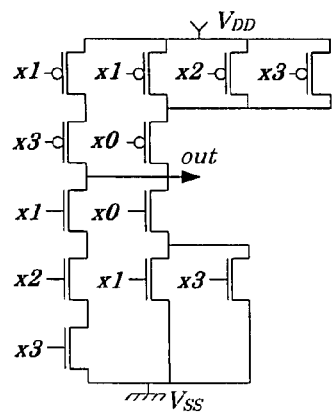
| Figure 26: | NCSP Circuit for the function $(057F)_{16}$. |
|---|---|
| on-set: | !x0*(!x3+!x2+!x1)+!x1*!x3 |
| off-set: | x1*x2*x3+x0*(x3+x1) |

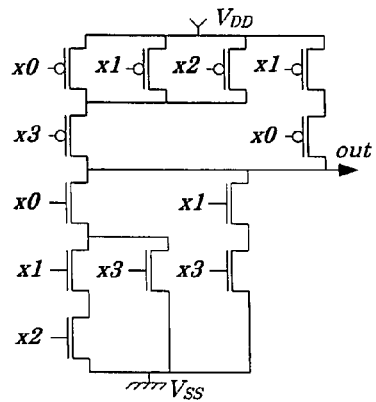
| Figure 27: | NCSP Circuit for the function (155F)$_{16}$. |
|---|---|
| on-set: | !x3*(!x2+!x0+!x1)+!x0*!x1 |
| off-set: | x0*(x1*x2+x3)+x1*x3 |
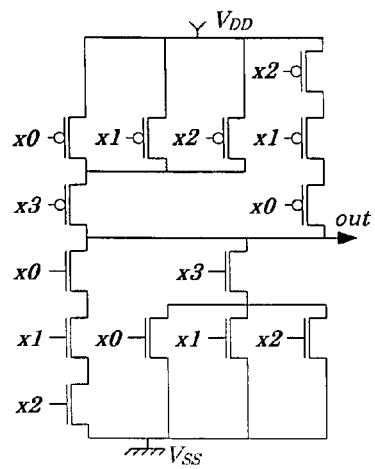
| Figure 28: | NCSP Circuit for the function (1557)$_{16}$. |
|---|---|
| on-set: | !x0*!x1*!x2+!x3*(!x2+!x1+!x0) |
| off-set: | x0*x1*x2+x3*(x2+x1+x0) |

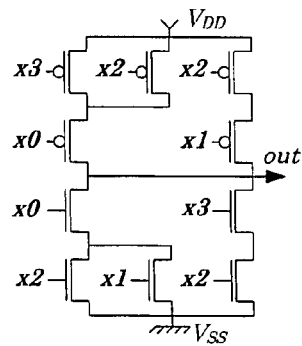
| Figure 29: | NCSP Circuit for the function $(0377)_{16}$. |
|---|---|
| on-set: | !x0*(!x3+!x2)+!x1*!x2 |
| off-set: | x0*(x2+x1)+x2*x3 |
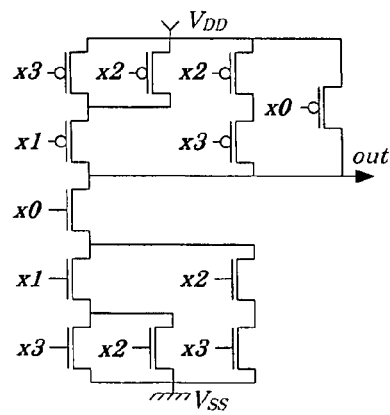
| Figure 30: | NCSP Circuit for the function $(17FF)_{16}$. |
|---|---|
| on-set: | !x1*(!x3+!x2)+!x2*!x3+!x0 |
| off-set: | x0*(x1*(x3+x2)+x2*x3) |

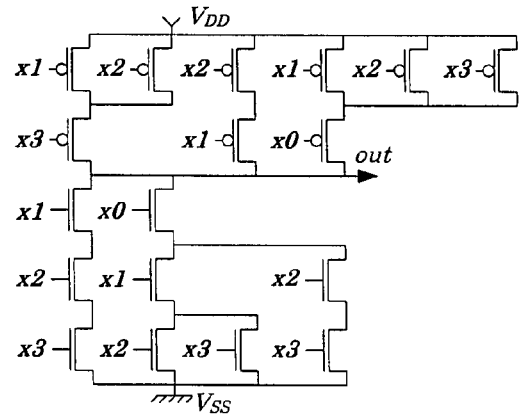
| Figure 31: | NCSP Circuit for the function $(177F)_{16}$. |
|---|---|
| on-set: | !x0*((!x2+!x1)+!x3)+!x3*(!x2+!x1)+!x1*!x2 |
| off-set: | 1*x2*x3+x0*(x1*(x3+x2)+x2*x3) |
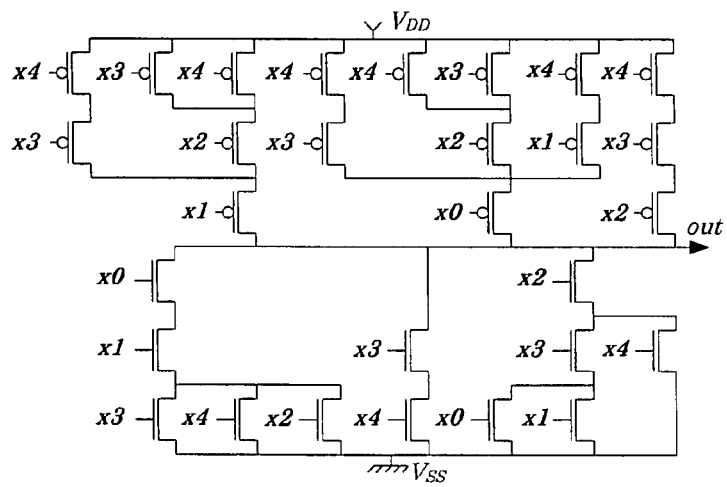
| Figure 32: | NCSP Circuit for the function $(01171757)_{16}$. |
|---|---|
| on-set: | !x2*!x3*!x4+!x0*(!x1*!x4+(!x2*(!x4+!x3)+!x3*!x4))+!x1*(!x2* (!x4+!x3)+!x3*!x4) |
| off-set: | x0*x1*(x4+x3+x2)+x2*(x3*(x1+x0)+x4)+x3*x4 |

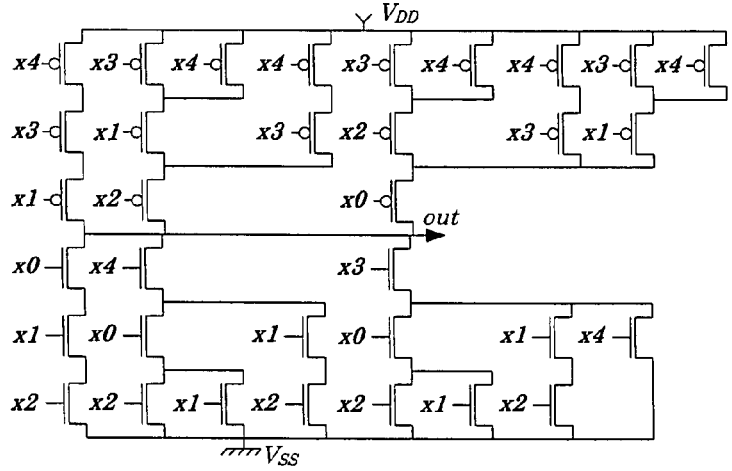
| Figure 33: | NCSP Circuit for the function $(01171777)_{16}$. |
|---|---|
| on-set: | !x1*!x3*!x4+!x0*(!x2*(!x4+!x3)+(!x1*(!x4+!x3)+!x3*!x4))+!x2*(!x1*(!x4+!x3)+!x3*!x4) |
| off-set: | x0*x1*x2+x3*((x0*(x1+x2)+x1*x2)+x4)+x4*(x0*(x1+x2)+x1*x2) |
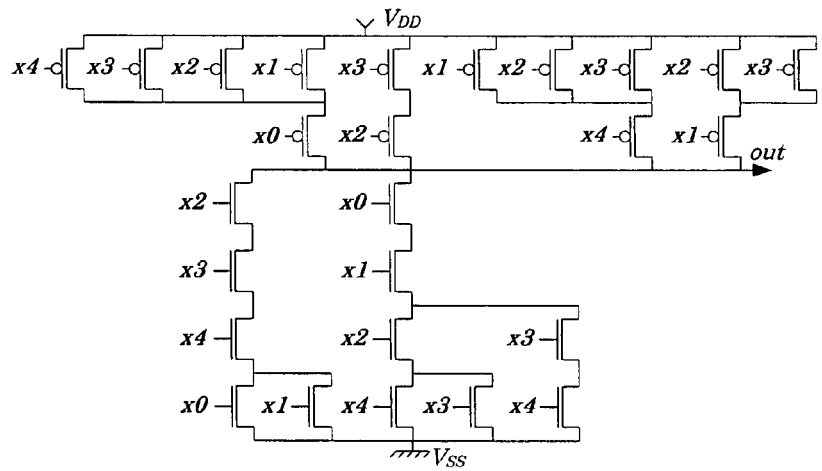
| Figure 34: | NCSP Circuit for the function $(177F7FFF)_{16}$. |
|---|---|
| on-set: | !x1*(!x3+!x2)+!x0*((!x3+!x2+!x1)+!x4)+!x4*(!x3+!x2+!x1)+!x2*!x3 |
| off-set: | x2*x3*x4*(x1+x0)+x0*x1*(x2*(x4+x3)+x3*x4) |

METHODS OF DERIVING SWITCH NETWORKS

This application claims the benefit of priority under 35 U.S.C. §119 from U.S. Patent Application No. 60/777,561, filed on Mar. 1, 2006 in the United States Patent and Trademark Office, the disclosure of which is incorporated herein by reference in its entirety.

The present invention relates to methods of obtaining switch networks with optimized parameters and in particular to a method of ensuring that the number of serial transistor of each plane or sets of paths connecting the output to a given value of a function is minimized. The object of the invention is to provide cells with the same functionality but with a reduced logical effort. A reduced logical effort can be translated into a reduction of area, power and/or delay when designing an integrated circuit.

Technology of this type may be seen in U.S. Pat. No. 7,003,738.

In a first aspect, the invention relates to a method of deriving a switch network adapted to carry out a multiple-valued function, such as a function defined by a truth table, and comprising a network relating to each of the multiple values of the function, the method comprising:

deriving one potential network for each of the multiple values of the function and using each of a plurality of different methods, and for each of the multiple values of the function, selecting, as the derived, potential network of the value of the function and of the switch network, one of the derived networks for the value, where the selected networks are derived by different methods.

In the present context, a switch network is a plurality of interconnected switches adapted to change characteristics (normally change a conducting behaviour) as a result of an input signal. These switches may be transistors, nanotubes, valves, relays, neurons, or the like.

A network of switches is adapted to carry out a function when the inputs of the function are the inputs to the switches and when the behaviour of the switches determines the output signal on an output of the network in accordance with the output of the function on the basis of the same inputs. A multiple-valued function is a function able to provide an output being chosen between a plurality of different possible values. A multiple-valued function having only two possible output values and two possible input values is a Boolean function.

Normally, a multiple-valued function may be described by a truth table describing the output of the function as a function of the possible inputs thereof.

In the present context, a network relating to a value of the function will be a network usually interconnecting a supply voltage representing the value of the function and the output. This network will comprise a number of switches, the inputs and behaviour of which interconnect the output to this voltage, when the output of the function requires this—and does not when the function requires that. Normally, only a single of these networks interconnects the output to a given voltage.

The overall network implementing the function may be divided up into networks relating to the different values of the function. Switches may be part of more than one of these networks.

In the present context, and as it will be described further below, a large number of methods exist of deriving networks either for a full function or for each of the networks thereof relating to an output value thereof. Some of these methods actually comprise firstly deriving one network for one output value and then deriving a network relating to another output value from the first network.

The finally selected networks may be represented individually or as an assembled/interconnected network representing the full function.

In the present context, two methods are different if they result in different networks representing the same value of the same function. In the present context, networks are primarily different, if they comprise different numbers of switches or have different numbers of parallel or serial switches between the output and the voltage corresponding to the value of the function (normally a supply voltage).

Preferably, the selecting step comprises selecting, as the network relating to the value of the function the derived, potential network having the lowest number of serial switches, normally between the output and a voltage supply. Having a low number of serial switches has a number of advantages both in speed and power consumption of the overall network.

In a particular embodiment, the selecting step comprises the steps of:

estimating a lowest number of serial switches of one or more of the networks by deriving from the function (such as from a truth table of the function) a covering table relating to the actual value [are1] of the function and having a number of cubes each covering one or more minterms, determining the lowest number of serial switches of the network as the number of literals in a cube having the largest number of literals and covering a minterm not covered by a cube having a lower number of literals, and selecting the network as a derived, potential network of the value of the function, the network fulfilling a predetermined criterion relating to the number of serial switches therein, the determined lowest number of serial switches, and/or the total number of switches in the potential network relating to the value of the function.

In the present context, a covering table is a table that relates cubes to the minterms covered by the cubes. In a covering table, the entries of the actual value of the function have been replaced by "1"'s and the remaining values with "0"'s (or any two values different from each other). In this situation, a cube is a product of literals, and literals are the variables of the function—or their complements.

A minterm is a cube containing one literal associated to each variable of the function. A minterm may be called an implicant minterm if, when the input variables thereof are presented to the function, this results in the function outputting the output value in question for the covering table.

A cube is an implicant cube if the minterms covered thereby are all implicant minterms. Preferably the cubes used in the present methods are the implicant cubes of the covering table.

A covering table comprises a number of prime implicant cubes which are those implicant cubes which are defined by the fewest literals. Thus, a prime implicant cube is an implicant cube from which, if a literal is removed, it is no longer an implicant cube. Preferably, a covering table will contain all possible prime implicant cubes and only those. The prime implicant cubes may be represented explicitly or implicitly in the covering table.

In the present context, a covering table may be represented in any suitable manner, such as a table, a list, a linked list, linked records or the like, normally stored in an electronic memory, such as a ROM, RAM; PROM, EPROM, EEPROM, or the like.

It should be noted that it is not required to actually remove e.g. cubes having a larger number of literals than the cube having the largest number of literals and covering a minterm not covered by a cube having a lower number of literals. The present lowest number may be determined from the cubes as present in the covering table.

When generating a network, it may be desired to take into account a subset of cubes from the covering table such that it does not contain any cube covering only minterms covered by other cubes in the subset. This will be described further below.

In one situation, the selecting step comprises the step of selecting, as the network relating to the value, a potential, derived network having a number of serially connected switches equal to the determined lowest number of serial switches. In this manner, it is ensured that the network selected has e.g. a high speed.

In another situation, the selecting step comprises the step of selecting, as the network relating to the value, a potential, derived network having the lowest total number of switches. A low total number of switches reduces the power consumption of the network, which is also a desired parameter.

In addition to using the above method for determining the lowest number of serial switches, it may also be used for other purposes.

In an interesting embodiment, the deriving step comprises deriving a potential network by
  deriving from the function (such as from a truth table of the function) a covering table for the pertaining value of the function and having a number of cubes each covering one or more minterms,
  estimating the lowest number of serial switches in the network as the number of literals in a cube having the largest number of literals and covering a minterm not covered by a cube having a lower number of literals (i.e. the number of literals in that or those of the cubes, which each covers a minterm not covered by a cube having a lower number of literals, and which has the most literals), and
  deriving the network on the basis of cubes of the covering table having a number of literals smaller than or equal to the estimated lowest number of serial switches of the network, the network having a number of parallel paths, each parallel path being defined by a cube and having a number of serially interconnected switches each having an input corresponding to a literal of the cube.

Normally, the parallel paths will, at their outer ends, be connected to each other and to the output at one end and a supply voltage at the other end.

Thus, by using this method, it is ensured that a network having the lowest possible number of serial switches from the output to the voltage (normally a supply voltage) is generated. It should be noted that switches may be shared between the individual paths, and that there are a number of manners of improving the network derived by this method.

In one situation, it is desired to provide the parallel paths of all cubes having a number of literals equal to or lower than the determined lowest number of serial switches in order to ensure that the full function of the function is maintained. However, it may be desired to provide this with a lower number of switches. This may be obtained, when the deriving step comprises deriving the network from only a subset of the cubes of the covering table having a number of literals smaller than or equal to the estimated lowest number of serial switches of the network, where each cube in the subset covers at least one minterm not covered by other cubes of the subset. In this manner, some of the paths (defined by the cubes no longer used) are removed, reducing the total number of switches of the network without affecting the overall functionality of the network.

In addition, it may be desired to have the method further comprise the step of improving a selected network by:
  identifying two parallel paths each comprising a switch having the same input and
  changing one of the identified paths to share the switch of the other identified path (or a new switch now common to both paths) with that input.

This method may be performed repeatedly for many or all switches or paths in that network in order to further improve the network.

Yet another manner of improving the network is one further comprising the steps of:
  determining an ordering of the inputs of the switches, from lowest to highest,
  defining a direction in a path of the network, and
  interchanging positions of two switches of the path if a lower order switch is positioned, along the direction, before a higher order switch.

In this context, the ordering may be one of e.g. power consumption or the switching velocity/timing of the switches. In addition, the direction of the path in the network normally is from the voltage (normally a supply voltage) to the output of the network.

Moving switches with higher probability of switching (such as switches controlled by the clock signal) to a position closer to the output of the network may reduce the overall power consumption of such network in that fewer nodes will then have to be charged for each switching of this signal. In addition, moving slower switches to positions closer to the output will reduce the negative impact of such devices on the network speed.

In a second aspect, the invention relates to a method of deriving a switch network adapted to carry out a predetermined multiple-valued function and comprising a network for each of the multiple values of the function, the method comprising:
  for at least one of the networks relating to a value of the function:
    deriving from the function (such as from a truth table of the function) a covering table for the pertaining value of the function and having a number of cubes each covering one or more minterms,
    estimating the lowest number of serial switches in the network as the number of literals in a cube having the largest number of literals and covering a minterm not covered by a cube having a lower number of literals, and
    deriving the network on the basis of the cubes of the covering table having a number of literals smaller than or equal to the estimated lowest number of serial switches of the network relating to the value of the function, the network having a number of parallel paths, each parallel path being defined by one cube and having a number of serially interconnected switches each having an input corresponding to a literal of the cube.

As mentioned above, it is not required to remove cubes from the covering table in order to be able to generate the network.

It is clear that cubes having a number of literals higher than the estimated lowest number of serial switches are not used. In addition, it is advantageous, however, that the deriving step comprises deriving the network from a subset of the cubes having a number of literals smaller than or equal to the estimated lowest number of serial switches of the network relating to the value of the function, where each cube in the subset covers at least one minterm not covered by other cubes of the subset.

As mentioned above, preferably the deriving step comprises the steps of:
identifying two parallel paths each comprising a switch having the same input and
changing one of the identified paths to share the switch of the other identified path with that input. Again, this may be performed repeatedly for many or all switches or paths in that network.

Also, the deriving step could comprise the steps of:
determining an ordering of the inputs of the switches, from lowest to highest,
defining a direction in a path of the network, and
interchanging positions of two switches of the path if a lower order switch is positioned, along the direction, before a higher order switch.

A third aspect of the invention relates to a method of determining a lowest number of serial switches in a switch network representing a value of a multiple-valued function, the method comprising:
deriving from the function (such as from a truth table thereof) a covering table associated to the value and having a number of cubes each covering one or more minterms, and
determining the lowest number of serial switches as the number of literals in a cube having the largest number of literals and covering a minterm not covered by a cube having a lower number of literals.

In the present context, a network represents a value of a function when the function outputs the value as a result of the correct inputs, as defined by the function. The function may be defined by a truth table.

As mentioned above, the covering table may comprise also non-prime implicant cubes, and it is not required to remove cubes from the covering table in order to determine the lowest possible number of serial transistors.

Different manners exist of determining the cube in question (i.e. a cube having the largest number of literals and covering a minterm not covered by a cube having a lower number of literals). One such manner is one wherein the determining step comprises the steps of:
determining, for each minterm, a cube covering the minterm and having the smallest number of literals, and
determining the lowest number of serial switches as the number of literals in a cube having the largest number of literals among the determined cubes.

Another method is one wherein the determining step comprises the steps of:
repeatingly identifying, in the covering table, a cube having a largest number of literals and determining whether each minterm which is covered by the identified cube is also covered by another cube having a lower number of literals, if so, removing the cube from the covering table, until no cube can be removed, and
determining the lowest number of serial switches as the number of literals in a cube having the largest number of literals in the covering table.

Instead of removing, it may suffice to mark the cubes and thereafter not use these again, so that the lowest number of serial switches is determined on the basis of non-marked cubes.

A fourth aspect of the invention relates to what may be called technology mapping of circuits or networks. More particularly, this aspect relates to a method of mapping a function or a network of switches, the method comprising:
for each of a plurality of parts of the function or the network, determining a logic sub-function implemented thereby and, for each of the values of the function, determining a lowest number of serial switches of a network representing the value of the sub-function, using the method according to the third aspect of the invention, and
selecting a subset of the determined parts, the parts of the subset implementing the function, and where each part, for each of the networks relating to a value of the sub-function of the part, has a lowest number of serial switches lower than a predetermined value.

Preferably, if the mapping is of a function, the function is described as a set of interconnected logic primitives, such as and-gates, or-gates, inverters or the like.

In this context, the full function or network is implemented by the parts when all parts of the function or network are present in at least one part.

The present method may be used on particular parts, such as parts identified using a predetermined search strategy, or the function/network may be divided into a plurality of parts, where all parts at least cover the full function/network once, and where all parts are then analyzed.

Preferably, a window defining the parts is moved stepwise over the function or network in a manner so that overlapping areas are defined and analyzed in order to identify the best division of the network and thereby the best potential improvement thereof.

In the present context, a sub-function implemented by a network present in a part is a logic function implemented by the logics of the network. Any network may be analyzed to result in a truth function or a function implemented thereby.

The overall analysis of the network/function results in a selection of parts (and a dividing of the network) which may be optimized as to the number of serial switches in each sub-network (relating to each of the values of the function). Another manner of dividing the network/function would be one wherein the subset is selected such that a given cost function for the overall function or network is minimized. This cost function may be total number of switches of the parts. The total number of switches has an influence on the overall area taken up, the power consumption as well as the speed of the function/network.

A fifth aspect of the invention relates to a method of improving a network or function, the method comprising:
defining a part of the function or the network, determining a logic sub-function implemented thereby and, for each of the values of the function, determining a lowest number of serial switches of a network representing the value of the sub-function, using the method according to the third aspect of the invention, and
replacing the part of the function or network by a network of switches, representing the sub-function and derived as described in relation to the second aspect of the invention.

Consequently, the dividing of the network/function may be as described in relation to the fourth aspect.

A sixth aspect of the invention relates to a computer program adapted to control a processor to carry out the process of any of the above aspects of the invention. Thus, a network or function is entered thereinto, and information relating to a network having a number of advantages is generated.

The above methods have been described in general for multiple-valued functions, including Boolean functions being a subgroup thereof having only two possible output values.

A seventh aspect of the invention relates to a method of deriving a switch network adapted to carry out a Boolean function and comprising a pull-up network and a pull-down network, the method comprising:
  deriving one potential pull-up network and one potential pull-down network using each of a plurality of different methods,
  selecting, as the pull-up network of the switch network, one of the derived pull-up networks, and
  selecting, as the pull-down network of the switch network, one of the pull-down networks, where the selected pull-up network and the selected pull-down network are derived by different methods.

In the present context, a pull-up network is a network representing the "1" or pull-up value of the function and is a network connecting the output to a higher voltage (such as a supply voltage) upon providing of the correct inputs to the switches of this network.

Also, the pull-down network is the network connecting the output to a lower voltage, such as ground or zero, upon providing of the correct inputs of the switches thereof.

As mentioned in relation to the first aspect of the invention, the methods will normally be different, if networks are generated, for the same value of the same function, having different numbers of serial switches or different total numbers of switches.

Also, as mentioned in relation to the first aspect, the final network may be represented by a mix of the two networks, where switches may actually be shared by the two networks.

Preferably, at least one of the selecting steps comprises selecting as the pull-up/down network a potential pull-up/down network having the lowest number of serial switches (normally between the output and a supply voltage).

In an interesting embodiment, the step of selecting the pull-up network comprises the steps of:
  estimating a lowest number of serial switches in the pull-up network by
    deriving from the function (such as from the Boolean table) a covering table of the function, which may comprise also non-prime implicant cubes, having a number of cubes each covering one or more minterms, and
    determining the lowest number of serial switches as the number of literals in a cube having the largest number of literals and covering a minterm not covered by a cube having a lower number of literals, and
  selecting the pull-up network as a derived, potential pull-up network fulfilling a predetermined criterion relating to the number of serial switches therein, the determined lowest number of serial switches, and/or the total number of switches in the potential pull-up network.

In that or another embodiment, the step of selecting the pull-down network may also comprise the steps of:
  estimating a lowest number of serial switches in the pull-down network by
    deriving (such as from the inverted Boolean table) a covering table of the inverted function and having a number of cubes each covering one or more minterms, and
    determining the lowest number of serial switches as the number of literals in a cube having the largest number of literals and covering a minterm not covered by a cube having a lower number of literals, and
  selecting the pull-down network as a derived, potential pull-down network fulfilling a predetermined criterion relating to the number of serial switches therein, the determined lowest number of serial switches, and/or the total number of switches in the potential pull-down network.

In any of the two above embodiments, the selecting step may comprise the step of selecting, as the pull-up/down network, the potential pull-up/down network having a number of serially connected switches equal to the determined lowest number of serial switches.

Also, in any of the above two embodiments, the selecting step may comprise the step of selecting, as the pull-up/down network, the potential pull-up/down network having the lowest total number of switches.

In an interesting embodiment, the deriving step of deriving a potential pull-up network comprises:
  deriving from the function (such as from the Boolean table) a first covering table having a number of cubes each covering one or more minterms,
  estimating the lowest number of serial switches in the pull-up network as the number of literals in a cube of the first covering table having the largest number of literals and covering a minterm not covered by a cube having a lower number of literals, and
  deriving the pull-up network on the basis of cubes of the first covering table having a number of literals smaller than or equal to the estimated lowest number of serial switches of the pull-up network, the network having a number of parallel paths (where individual switches may be shared between paths), each parallel path being defined by one cube and having a number of serially interconnected switches each having an input corresponding to a literal of the cube.

In the same or another embodiment, the deriving step of deriving a potential pull-down network comprises:
  deriving (such as from the Boolean table) from the inverted function a second covering table having a number of cubes each covering one or more minterms,
  estimating the lowest number of serial switches in the pull-down network as the number of literals in a cube of the second covering table having the largest number of literals and covering a minterm not covered by a cube having a lower number of literals, and
  deriving the pull-down network on the basis of cubes of the second covering table having a number of literals smaller than or equal to the estimated lowest number of serial switches of the pull-down network, the network having a number of parallel paths (where individual switches again may be shared between paths), each parallel path being defined by one cube and having a number of serially interconnected switches each having an input corresponding to a literal of the cube.

In any of the above two embodiments, the deriving step may comprise deriving the network either from all cubes having a number of literals lower than or equal to the lowest number of serial switches or from a subset of the cubes having a number of literals smaller than or equal to the estimated lowest number of serial switches, where each cube in the subset covers at least one minterm not covered by other cubes in the subset.

Preferably, the method further comprises the steps of improving a selected network by:
  identifying two parallel paths each comprising a switch having the same input and changing one of the identified paths to share the switch of the other identified path with that input.

These steps may be performed repeatedly for many or all switches or paths in that network.

Also, the method may further comprise the steps of improving a selected network by:
  determining an ordering of the inputs of the switches, from lowest to highest,
  defining a direction in a path of the network, and
  interchanging positions of two switches of the path if a lower order switch is positioned, along the direction, before a higher order switch.

An eighth aspect of the invention relates to a method of deriving a switch network adapted to carry out a predetermined Boolean function and comprising a pull-up network and a pull-down network, the method comprising:
  deriving from the function (such as from the Boolean table) a first covering table (which may comprise also non-prime implicant cubes) having a number of cubes each covering one or more minterms,
  estimating the lowest number of serial switches in the pull-up network as the number of literals in a cube of the first covering table having the largest number of literals and covering a minterm not covered by a cube having a lower number of literals,
  deriving the pull-up network on the basis of cubes of the first covering table having a number of literals smaller than or equal to the estimated lowest number of serial switches of the pull-up network, the network having a number of parallel paths (where individual switches may be shared between paths), each parallel path being defined by one cube and having a number of serially interconnected switches each having an input corresponding to a literal of the cube,
  deriving from the inverted function (such as from the Boolean table) a second covering table (which again may comprise also non-prime implicant cubes) having a number of cubes each covering one or more minterms,
  estimating the lowest number of serial switches in the pull-down network as the number of literals in a cube of the second covering table having the largest number of literals and covering a minterm not covered by a cube having a lower number of literals, and
  deriving the pull-down network on the basis of cubes of the second covering table having a number of literals smaller than or equal to the estimated lowest number of serial switches of the pull-down network, the network having a number of parallel paths (where individual switches again may be shared between paths), each parallel path being defined by one cube and having a number of serially interconnected switches each having an input corresponding to a literal of the cube.

In that aspect, the deriving step preferably comprises deriving the network from either all cubes of the covering table or a subset of the cubes of the covering table, where each cube in the subset covers at least one minterm not covered by other cubes of the subset.

In addition, the deriving step may comprise the steps of:
  identifying two parallel paths each comprising a switch having the same input and
  changing one of the identified paths to share the switch of the other identified path with that input.

As mentioned above, these steps may be performed repeatedly for many or all switches or paths in that network.

Also, the deriving step may comprise the steps of:
  determining an ordering of the inputs of the switches, from lowest to highest,
  defining a direction in a path of the network, and
  interchanging positions of two switches of the path if a lower order switch is positioned, along the direction, before a higher order switch.

A ninth aspect of the invention relates to a method of determining a lowest number of serial switches in a pull-up network of a switch network adapted to carry out a Boolean function, the method comprising:
  deriving, from the function, a covering table having a number of cubes each covering one or more minterms,
  determining the lowest number of serial switches as the number of literals in a cube having the largest number of literals and covering a minterm not covered by a cube having a lower number of literals.

A tenth aspect of the invention relates to a method of determining a lowest number of serial switches in a pull-down network of a switch network adapted to carry out a Boolean function, the method comprising:
  deriving, from the inverted function, a covering table having a number of cubes each covering one or more minterms, and
  determining the lowest number of serial switches as the number of literals in a cube having the largest number of literals and covering a minterm not covered by a cube having a lower number of literals.

In the ninth or tenth aspects, the determining step may comprise the steps of:
  determining, for each minterm, the cube covering the minterm and having the smallest number of literals, and
  determining the lowest number of serial switches as the number of literals in a cube having the largest number of literals among the determined cubes.

In addition, in the ninth or tenth aspects, the determining step may comprise the steps of:
  repeatingly identifying, in the covering table, a cube having a largest number of literals and determining whether each minterm which is covered by the identified cube is also covered by another cube having a lower number of literals, if so, removing the cube from the covering table,
  until no cube can be removed, and
  determining the lowest number of serial switches as the number of literals in a cube having the largest number of literals in the covering table.

As described above, an alternative is one in which the cubes are not removed but marked and where the determining step is performed only on non-marked cubes.

An eleventh aspect of the invention relates to a method of mapping a Boolean function (which may be described as a set of interconnected logic primitives, such as and-gates, or-gates, inverters or the like) or a network of switches, the method comprising:
  for each of a plurality of parts of the function or the network, determining a logic sub-function implemented thereby, determining a lowest number of serial switches of the pull-up network of the sub-function using the method according to the ninth aspect, and determining a lowest number of serial switches of the pull-down network of the sub-function using the method according to the tenth aspect, and
  selecting a subset of the determined parts, the parts of the subset implementing the function, and where each part, for each of the pull-up and pull-down networks of the sub-function implemented by the part, has a lowest number of serial switches lower than a predetermined value.

Preferably, the subset is selected such that a given cost function for the overall function or network is minimized. This cost function may be the total number of switches as described above.

A twelfth aspect of the invention relates to a method of improving a network or function, the method comprising:

defining a part of the function or the network, determining a logic sub-function implemented thereby, determining a lowest number of serial switches of the pull-up network of the sub-function using the method according to the ninth aspect, and determining a lowest number of serial switches of the pull-down network of the sub-function using the method according to the tenth aspect, and replacing the part of the function or network by a network of switches, in each network relating to a value of the function, as derived in the eighth aspect.

A thirteenth aspect of the invention relates to a computer program adapted to control a processor to carry out the method according to any of the sixth to twelfth aspects.

A fourteenth aspect of the invention relates to a circuit or gate from the group consisting of the networks illustrated in FIGS. 25-34. Naturally, this aspect, and the relating claim, also covers networks derivable from the networks in FIGS. 25-34, where the order of serially interconnected switches has been altered, and/or in which two parallel branches share a switch in the network of the claim whereas the same parallel branches of a corresponding network each has a switch, or where two parallel branches in a network of the claim each has a switch controlled by the same input and where the parallel branches of a corresponding network shares a switch controlled by that input.

In the following, preferred embodiments of the invention will be described with reference to the drawing, wherein:

FIG. 1 illustrates a flow diagram for minimum length stacks,

FIG. 2 is a truth table for a function,

FIG. 3 illustrates a bridge-based 5-4 cell for the function of FIG. 2,

FIG. 4 illustrates a BDD-based 4-4 PTL for the function of FIG. 2,

FIG. 5 illustrates CSP CMOS cells obtained from the on-set functions of the function of FIG. 2, FIG. 6 illustrates CSP CMOS cells obtained from the off-set functions of the function of FIG. 2, FIG. 7 illustrates CSP CMOS cells (factorized) for the function (on-set equation) of FIG. 2, FIG. 8 illustrates CSP CMOS cells (factorized) for the function (off-set equation) of FIG. 2, FIG. 9 illustrates a covering table obtained from the on-set of the function of FIG. 2, FIG. 10 illustrates a covering table obtained from the off-set of the function of FIG. 2, FIG. 11 illustrates NCSP CMOS cells for the function of FIG. 2, FIG. 12 illustrates an alternative NCSP CMOS cell to that of FIG. 11a, FIG. 13 illustrates a truth table for another function, FIG. 14 illustrates a covering table obtained from the on-set of the function of FIG. 13, FIG. 15 illustrates a covering table obtained from the off-set of the function of FIG. 13, FIG. 16 illustrates NCSP CMOS cells for the on-set equations of the function of FIG. 13, FIG. 17 illustrates NCSP CMOS cells for the off-set equations of the function of FIG. 13, FIG. 18 illustrates NCSP CMOS cells for the function of FIG. 13, FIG. 19 illustrates a circuit to be mapped with cells from a library, FIG. 20 illustrates two different matchings for the same node on the circuit of FIG. 19, FIG. 21 illustrates two alternative coverings using the matchings of FIG. 20, FIG. 22 illustrates counting serial transistors by serial parallel association of the network of FIG. 19, FIG. 23 illustrates the division of the circuit of FIG. 19 into two cells, FIG. 24 illustrates the counting of serial transistors in the network of FIG. 19 by the method of the invention, FIGS. 25-34 illustrate examples of networks which are obtainable using the method of the invention.

A first preferred embodiment comprises a method of systematically generating digital cells of complex gate functions with an optimal or optimized length of stacked switches (switch chain) for the pull-up and pull-down networks of a Boolean function. This method is able to generate optimized cell logic functions where the most used standard implementations, such as the Complementary Serial/Parallel CMOS and Pass-Transistor Logic, do not produce networks with minimum length transistor chains. For these functions, new, efficient transistor networks implementations have been obtained that will result in minimum length switch stacks. The presented networks follow neither the Complementary Serial/Parallel CMOS nor the Pass-Transistor Logic topologies. In addition, it is possible to catalogue a selected set of logic functions whose switch-based circuits are better implemented using the below method.

In the present description, each cell (circuit) is characterized by a pair p-n, where p represents the length of its longest pull-up path and n represents the length of its longest pull-down path.

There are several ways to implement a switch network. The common factor among these implementations are the presence of paths which pull up the output to logic one (pull-up network or pull-up plane) and paths which pull down the output to logic zero (pull-down network or pull-down plane).

For the sake of compatibility with most of the circuits available today, the examples presented here will use transistors as switches (pMOS for pull-up plane and nMOS for pull-down plane). However, the method presented hereby is not restricted to transistors and may be used with any kind of switch available (valve, relay, nanotube, etc.).

In FIG. 2, an example of a function is given, and the preferred method will now be illustrated in relation to this function. An integer number is used to represent the function, most of the time in hexadecimal radix. This number is built grouping the 4-bit output sets of the truth-table. In the example presented in FIG. 2 the output compounds the integer $(0000\ 0001\ 1001\ 0111)_2 = (0197)_{16}$.

Naturally, a number of different networks may be generated which embodies or carries out this function, a number of manners exist of deriving these networks, and a number of manners exist of actually representing these networks.

For example, in FIG. 3, a 5-4 bridge-based circuit is illustrated which embodies the function of FIG. 2.

FIG. 4, a 4-4 PTL (Pass-Transistor Logic) network corresponding to the logic function $(0197)_{16}$ shown in FIG. 2 is illustrated. There are several ways to implement a PTL network but the one presented in FIG. 4 is based on a Binary Decision Diagram (BDD).

Another way of implementing a logic function is obtained by extracting a representative logic equation and mapping it into a serial/parallel switch network. The prime irredundant equations for the function $(0197)_{16}$ can be obtained by two-level minimization. The logic equation eq. 1 represents the on-set of the function $(0197)_{16}$ while the logic equation eq. 2 represents the off-set for the same function.

$$f_{on-set} = \bar{a} \cdot \bar{b} \cdot \bar{c} + \bar{a} \cdot \bar{b} \cdot \bar{d} + \bar{a} \cdot \bar{c} \cdot \bar{d} + \bar{a} \cdot b \cdot c \cdot d + \bar{b} \cdot \bar{c} \cdot \bar{d}, \quad \text{(eq. 1)}$$

$$f_{off-set} = \bar{b} \cdot c \cdot d + b \cdot \bar{c} \cdot d + b \cdot c \cdot \bar{d} + a \cdot d + a \cdot c + a \cdot b. \quad \text{(eq. 2)}$$

FIGS. 5 and 6 show Complementary Serial/Parallel CMOS (CSP) networks for the function $(0197)_{16}$. FIG. 5 presents the networks based on the on-set equation and FIG. 6 presents the networks based on the off-set. For each CSP circuit in FIGS. 5 and 6, one plane is derived from the equation and the other one as a topological complement.

In order to reduce the number of switches in the networks, both on-set and off-set equations (eq. 1 and eq. 2 respectively) can be factorized. Possible factorizations for the equations eq. 1 and eq. 2 are demonstrated as follows by eq. 3 and eq. 4.

$$f_{on-set} = (\bar{a} + \bar{b} \cdot \bar{c} \cdot \bar{d}) \cdot (\bar{b} + (\bar{c} + d) \cdot (c + \bar{d})) \cdot (b + \bar{c} + \bar{d}), \quad \text{(eq. 3)}$$

$$f_{off-set} = (a + (\bar{b} + \bar{c} + \bar{d}) \cdot (b + c \cdot d) \cdot (c + d)) \cdot (b + c + d). \quad \text{(eq. 4)}$$

This factorization leads to the optimized networks presented in FIGS. 7 and 8.

Thus, it is seen that different networks with different numbers of serial transistors/switches and different numbers of total transistors/switches are obtained by these different methods.

Thus, by simply selecting the optimal pull-up network and the optimal pull-down network independently of the method used for generating the network, an optimized network may be obtained.

This may be implemented by simply deriving a large number of pull-up networks and a large number of pull-down networks and then finally determining which pull-up network and which pull-down network to use.

An alternative to that method is seen in FIG. 1, which is a diagram illustrating a manner of determining parameters of the optimal pull-up and pull-down networks. In this manner, the generation of pull-up networks and pull-down networks may be stopped once networks having the optimal parameters have been derived.

In the methodology illustrated in FIG. 1, pull-up and pull-down networks are generated by different methods and then a pull-up/down pair which respects the lower bounds for the number of serial switches is selected. The lower bound is preferably evaluated for both on- and off-set extracted from the function under evaluation. Hence, the evaluation of lower bounds favours the construction of the covering tables for both on- and off-set. FIG. 9 shows the covering table for the on-set of the function presented $(0197)_{16}$ while FIG. 10 shows the covering table for the off-set of the same function.

From the covering table in FIG. 9 it is seen that the cube with more literals ($\bar{a} \cdot b \cdot c \cdot d$) cannot be removed from the final cover as it is an essential prime implicant cube, meaning it is the only cube to cover one of the implicant minterms. Hence, the lower bound for the number of serial switches for the on-set is 4 (the number of literals in the cube). For the covering table in FIG. 10, the lower bound evaluated is 3. Hence, the circuit with pull-up/down networks respecting the lower bounds will be 3-4 or 4-3.

FIG. 11 shows implementations of minimum length transistor chains for the example function $(0197)_{16}$. It is seen that none of the implementations of FIGS. 2-8 have minimum length switch stacks. Even worse is the fact that some circuit implementations, like the ones in FIGS. 5, 6, 7 and 8, may not even be feasible due to the long transistor stacks: a circuit is usually unfeasible for practical applications when it has paths with more than 4 serial transistors. The theory behind the evaluation of the lower bound in path length for pull-up and pull-down networks in a circuit is further described in "Exact lower bound for the number of switches in series to implement a combinational logic cell.", F. R. Schneider, R. P. Ribas, S. S. Sapatnekar, A.I.Reis. International Conference on Computer Design, October 2005, pp. 357-362.

Generally, the order of the switches in serial switch stacks is another optimization that could be considered in order to generate circuits with better performance: switches with slower input slopes advantageously could be positioned closer to the output in order to improve the overall performance, while nodes with more connected switches advantageously could be positioned far from the output in order to reduce fanout capacitance.

For instead, considering that the inputs d and $\bar{d}$ in the circuits presented in FIG. 11 are the slowest ones, the transistors, having d and $\bar{d}$ as input signals, could be moved to a position closer to the output, so the negative impact in circuit's overall performance would be reduced. FIG. 12 shows the alternative network for the suggested ordering of FIG. 11.*b*, still maintaining the nodes of greater order (more connected switches) as far as possible from the output.

In order to better exemplify the lower bound evaluation used to choose the correct networks for minimum transistor stacks, this will be illustrated with another function, the truth table of which is illustrated in FIG. 13. This function is a 5-input function whose representative hexadecimal integer is $(F1D12F33)_{16}$.

The prime irredundant equations for the function $(F1D12F33)_{16}$ obtained by two-level minimization are given in eq. 5 for the on-set and eq. 6 for the off-set.

$$f_{on-set} = \bar{a} \cdot \bar{b} \cdot \bar{d} + \bar{a} \cdot b \cdot \bar{c} + a \cdot \bar{d} \cdot \bar{e} + a \cdot c \cdot d + b \cdot c \cdot \bar{d} \cdot e, \quad \text{(eq. 5)}$$

$$f_{off-set} = \quad \text{(eq. 6)}$$
$$\bar{a} \cdot b \cdot c \cdot \bar{e} + \bar{a} \cdot c \cdot d + a \cdot \bar{b} \cdot \bar{d} \cdot e + a \cdot \bar{c} \cdot e + a \cdot \bar{c} \cdot d + \bar{b} \cdot \bar{c} \cdot d.$$

These equations were generated aiming at a smaller set of cubes. However, if one evaluates the lower bound just by looking for the cube with more literals, it will be wrongly assumed that the lower bounds for the function $(F1D12F33)_{16}$ should be 4-4. However, the covering table for the on-set of this function (FIG. 14) shows that the cube (prime implicant) with more literals on the equation eq. 5 (striked-out line) can be removed without losing the cover of all minterms. In equation eq. 7, an equivalent representation for equation eq. 5 is given where the cube with four literals has been replaced by a pair of cubes with only three literals.

$$f_{on-set} = \bar{a} \cdot \bar{b} \cdot \bar{d} + \bar{a} \cdot b \cdot \bar{c} + a \cdot \bar{d} \cdot \bar{e} + a \cdot c \cdot d + \bar{a} \cdot \bar{d} \cdot e + a \cdot b \cdot c. \quad \text{(eq. 7)}$$

The off-set covering table in FIG. 15 shows that the same reduction cannot be done to the off-set equation eq. 6 once in that the cubes with the largest number of literals are essential prime implicants, which means they cannot be removed from the final solution. It means that the evaluation of lower bounds for the function $(F1D12F33)_{16}$ should deliver 3-4/4-3 circuits.

The equations of eq. 7 (on-set) and eq. 6 (off-set) can be further factorized, and possible results are provided by equations eq. 8 and eq. 9, respectively.

$$f_{on-set} = \bar{a} \cdot (\bar{d} \cdot (e + \bar{b}) + b \cdot \bar{c}) + a \cdot (c \cdot (d + b) + \bar{d} \cdot \bar{e}), \quad \text{(eq. 8)}$$

$$f_{off-set} = \bar{a} \cdot c \cdot (b \cdot \bar{e} + d) + \bar{b} \cdot \bar{c} \cdot d + a \cdot (\bar{b} \cdot \bar{d} \cdot e + \bar{c} \cdot (e + d)). \quad \text{(eq. 9)}$$

In FIG. 16 and FIG. 17, circuits using the regular CSP CMOS approach are shown using the factorized equations in eq. 8 and eq. 9, respectively. The pull-up/down networks of these circuits were used in FIG. 18 to generate NCSP circuits with minimum length transistor chains.

The present embodiments may also be used to catalogue the functions where the previously used logic topologies will not produce minimum length transistor chain implementations. For these functions a minimum length switch chain implementation is obtainable, based on a key (hexadecimal integer) for finding the function. This catalogue presents all the 4-input functions where a topologically serial/parallel complementary CMOS topology does not produce a minimum length transistor network. It also presents a catalogue with a set of feasible 5- and 6-input negative unate functions (i.e. transistor chains with at most 4 transistors) where CSP circuit do not respect lower bounds. However, the method of generating minimum length transistor chains described hereby can be applied to any n-input function. FIGS. 25-34 illustrate such networks which [1][FRS2]are obtained in this manner.

Another embodiment relates to technology mapping is well known as the synthesis step where the choice of cells from a library that will be effectively used in the final circuit layout are chosen. For instance, consider FIG. 19 that shows an equation to be mapped.

The first step in technology mapping is known as matching and it basically identifies portions of the initial equation that may be implemented by using cells from the library. For instance, FIG. 20 shows two matchings at the output node of the equation in FIG. 19.

The second step in technology mapping is known as covering, and it chooses a set of matchings that completely implements the equation to be mapped. FIG. 21 shows two alternative complete coverings, each using one of the alternative matchings presented in FIG. 20.

Technology mapping algorithms based on automatic library generators normally performing a matching phase that is based on counting the number of serial transistors that a cell would have. Normally this counting is done by serial parallel association counting, as it is well known in previous art. FIG. 22 shows the serial parallel counting for the equation in FIG. 19. It is possible to see that this equation will have 5 serial transistors in one plane and 4 serial transistors in the other. These numbers are not minimal, as will be described further below, but they are the values effectively obtained by serial parallel association calculation, which is the known way of doing it. As for current standard fabrication technologies, it is widely accepted that a maximum of 4 NMOS and 3 PMOS transistors in series is the limit of acceptable for a single cell, the equation in FIG. 22 would not be implemented as a single cell, as no valid matchings will be produced at the output, due to the excessive number of serial transistors. As seen in FIG. 23, this function will, using the prior art method, be implemented using two cells.

However, if the calculation is done using the above-mentioned method according to the method, smaller values will result. Thus, it is actually possible, using the method of the invention, to provide networks with even lower numbers of serial transistors, as shown in FIG. 24. Thus, the present method allows the advantage of arriving at a true minimum number of serial transistors, which results in larger portions of the circuit to be feasible as single cells. This effect potentially produces speed improvements as well as area and power savings due to the use of a smaller number of cells. For instance, the circuit of the equation illustrated in FIG. 24 can be implemented as a single cell with 3 and 4 serial transistors using the method according to the invention.

The invention claimed is:

1. A method of determining a lowest number of serial switches in a switch network representing a value of a multiple-valued function, the method comprising:
   deriving, by a processor, from the function a covering table associated to the value and having a number of cubes each covering one or more minterms, and
   determining, by the processor, the lowest number of serial switches as the number of literals in a cube having the largest number of literals and covering a minterm not covered by a cube having a lower number of literals.

2. A method of according to claim 1, wherein the determining step comprises the steps of:
   determining, for each minterm, a cube covering the minterm and having the smallest number of literals,
   determining the lowest number of serial switches as the number of literals in a cube having the largest number of literals among the determined cubes.

3. A method according to claim 1, wherein the determining step comprises the steps of:
   repeatedly identifying, in the covering table, a cube having a largest number of literals and determining whether each minterm, which is covered by the identified cube, is also covered by another cube having a lower number of literals, if so, removing the cube from the covering table, until no cube can be removed, and
   determining the lowest number of serial switches as the number of literals in a cube having the largest number of literals in the covering table.

4. A method of mapping a function or a network of switches, the method comprising:
   for each of a plurality of parts of the function or the network, determining a logic sub-function implemented thereby and, for each of the values of the function, determining a lowest number of serial switches of a network representing the value of the sub-function, using the method according to claim 1, and
   selecting a subset of the determined parts, the parts of the subset implementing the function, and where each part, for each of the networks relating to a number of the function represented by the sub-function of the part, has a lowest number of serial switches lower than a predetermined value.

5. A method according to claim 4, wherein the subset is selected such that a given cost function for the overall function or network is minimized.

6. A method of determining a lowest number of serial switches in a pull-up network of a switch network adapted to carry out a Boolean function, the method comprising:

deriving, by a processor, from the function, a covering table having a number of cubes each covering one or more minterms, determining, by the processor, the lowest number of serial switches as the number of literals in a cube having the largest number of literals and covering a minterm not covered by a cube having a lower number of literals.

7. A method of according to claim 6, wherein the determining step comprises the steps of:

determining, for each minterm, the cube covering the minterm and having the smallest number of literals determining the lowest number of serial switches as the number of literals in a cube having the largest number of literals among the determined cubes.

8. A method according to claim 6, wherein the determining step comprises the steps of:

repeatedly identifying, in the covering table, a cube having a largest number of literals and determining whether each minterm which is covered by the identified cube is also covered by another cube having a lower number of literals, if so, removing the cube from the covering table, until no cube can be removed, and determining the lowest number of serial switches as the number of literals in a cube having the largest number of literals in the covering table.

9. A method of mapping a Boolean function or a network of switches, the method comprising:

for each of a plurality of parts of the function or the network, determining a logic sub-function implemented thereby, determining a lowest number of serial switches of the pull-up network of the sub-function using the method according to claim 6, and determining a lowest number of serial switches of the pull-down network of the sub-function, and selecting a subset of the determined parts, the parts of the subset implementing the function, and where each part, for each of the pull-up and pull-down networks of the sub-function implemented by the part, has a lowest number of serial switches lower than a predetermined value.

10. A method according to claim 9, wherein the subset is selected such that a given cost function for the overall function or network is minimized.

11. A non-transistory computer readable medium adapted to control a processor to carry out the method according to claim 9.

12. A method of improving a network or function, the method comprising:

defining a part of the function or the network, determining a logic sub-function implemented thereby, determining a lowest number of serial switches of the pull-up network of the sub-function using the method according to claim 6, and determining a lowest number of serial switches of the pull-down network of the sub-function using the method, deriving from the function a first covering table having a number of cubes each covering one or more minterms, estimating the lowest number of serial switches in the pull-up network as the number of literals in a cube of the first covering table having the largest number of literals and covering a minterm not covered by a cube having a lower number of literals, deriving the pull-up network on the basis of cubes of the first covering table having a number of literals smaller than or equal to the estimated lowest number of serial switches of the pull-up network, the network having a number of parallel paths, each parallel path being defined by one cube and having a number of serially interconnected switches each having an input corresponding to a literal of the cube, deriving from the inverted function a second covering table having a number of cubes each covering one or more minterms, estimating the lowest number of serial switches in the pull-down network as the number of literals in a cube of the second covering table having the largest number of literals and covering a minterm not covered by a cube having a lower number of literals, deriving the pull-down network on the basis of cubes of the second covering table having a number of literals smaller than or equal to the estimated lowest number of serial switches of the pull-down network, the network having a number of parallel paths, each parallel path being defined by one cube and having a number of serially interconnected switches each having an input corresponding to a literal of the cube, and replacing the part of the function or network by a network of switches, in each network relating to a value of the function.

13. A non-transistory computer readable medium adapted to control a processor to carry out the method according to claim 12.

14. A non-transistory computer readable medium adapted to control a processor to carry out the method according to claim 6.

15. A method of determining a lowest number of serial switches in a pull-down network of a switch network adapted to carry out a Boolean function, the method comprising:

deriving, by a processor, from the inverted function, a covering table having a number of cubes each covering one or more minterms, determining, by the processor, the lowest number of serial switches as the number of literals in a cube having the largest number of literals and covering a minterm not covered by a cube having a lower number of literals.

16. A non-transistory computer readable medium adapted to control a processor to carry out the method according to claim 15.

* * * * *